US 12,429,565 B2

(12) United States Patent
Laflaquière et al.

(10) Patent No.: US 12,429,565 B2
(45) Date of Patent: Sep. 30, 2025

(54) SINGLE-CHIP OPTICAL TRANSCEIVER

(71) Applicant: Apple Inc., Cupertino, CA (US)

(72) Inventors: Arnaud Laflaquière, Paris (FR); Cristiano L Niclass, San Jose, CA (US); Marc Drader, Waterloo (CA)

(73) Assignee: Apple Inc., Cupertino, CA (US)

( * ) Notice: Subject to any disclaimer, the term of this patent is extended or adjusted under 35 U.S.C. 154(b) by 799 days.

(21) Appl. No.: 17/714,161

(22) Filed: Apr. 6, 2022

(65) Prior Publication Data
US 2022/0404475 A1 Dec. 22, 2022

Related U.S. Application Data

(60) Provisional application No. 63/245,878, filed on Sep. 19, 2021, provisional application No. 63/211,020, filed on Jun. 16, 2021.

(51) Int. Cl.
| | |
|---|---|
| *G01S 7/4863* | (2020.01) |
| *G01S 17/10* | (2020.01) |
| *H01L 23/00* | (2006.01) |

(52) U.S. Cl.
CPC ............ *G01S 7/4863* (2013.01); *G01S 17/10* (2013.01); *H01L 24/08* (2013.01); *H01L 24/80* (2013.01);
(Continued)

(58) Field of Classification Search
CPC ........ G01S 7/484; G01S 7/486; G01S 7/4863; G01S 17/10; G01S 17/894;
(Continued)

(56) References Cited

U.S. PATENT DOCUMENTS

| | | | |
|---|---|---|---|
| 5,567,955 | A | 10/1996 | Liu |
| 5,753,928 | A | 5/1998 | Krause |
| | | (Continued) | |

FOREIGN PATENT DOCUMENTS

| | | |
|---|---|---|
| CN | 103378109 A | 10/2013 |
| CN | 106531822 A | 3/2017 |
| | (Continued) | |

OTHER PUBLICATIONS

EP Application # 22169910.1 Search Report dated Sep. 9, 2022.
(Continued)

*Primary Examiner* — Michael A Lyons
(74) *Attorney, Agent, or Firm* — Meitar Patents Ltd.; Daniel Kligler

(57) ABSTRACT

An optoelectronic device includes a first semiconductor die, having first front and rear surfaces and including at least one avalanche photodetector configured to output electrical pulses in response to photons incident on the first front surface. A second semiconductor die has a second front surface, which is bonded to the first rear surface, and a second rear surface, and includes a photodetector receiver analog circuit coupled to the at least one avalanche photodetector and an emitter driver circuit configured to drive a pulsed optical emitter. A third semiconductor die has a third front surface, which is bonded to the second rear surface, and a third rear surface, and includes logic circuits coupled to control the photodetector receiver analog circuit and the emitter driver circuit and to receive and process the electrical pulses output by the at least one avalanche photodetector.

20 Claims, 8 Drawing Sheets

(52) U.S. Cl.
CPC ........... *H01L 2224/08145* (2013.01); *H01L 2224/80895* (2013.01); *H01L 2224/80896* (2013.01); *H01L 2924/10253* (2013.01); *H01L 2924/10329* (2013.01); *H01L 2924/12042* (2013.01); *H01L 2924/12043* (2013.01); *H01L 2924/1426* (2013.01); *H01L 2924/1431* (2013.01)

(58) Field of Classification Search
CPC . H01L 2224/08145; H01L 2924/10253; H01L 2224/80895; H01L 2224/80896
See application file for complete search history.

(56) References Cited

U.S. PATENT DOCUMENTS

| | | |
|---|---|---|
| 5,780,867 A | 7/1998 | Fritz et al. |
| 6,028,323 A | 2/2000 | Liu |
| 8,781,687 B2 | 7/2014 | Han et al. |
| 10,132,929 B2 | 11/2018 | Albert et al. |
| 10,411,146 B1 | 9/2019 | Arlyawansa et al. |
| 11,322,630 B2 | 5/2022 | Li et al. |
| 2005/0041714 A1 | 2/2005 | Kim |
| 2005/0083567 A1 | 4/2005 | Chun Liu et al. |
| 2014/0321700 A1 | 10/2014 | Zhan |
| 2015/0200314 A1 | 7/2015 | Webster |
| 2016/0246018 A1 | 8/2016 | Pinguet et al. |
| 2017/0025398 A1* | 1/2017 | Beyer ............... H01L 25/043 |
| 2017/0069677 A1 | 3/2017 | Saruwatari et al. |
| 2018/0301589 A1* | 10/2018 | Burroughs ........... H01S 5/0262 |
| 2019/0363520 A1 | 11/2019 | Aflaquiere et al. |
| 2020/0191925 A1 | 6/2020 | Zheng et al. |
| 2020/0266316 A1 | 8/2020 | Fan |
| 2020/0278426 A1 | 9/2020 | Dummer et al. |
| 2020/0309955 A1 | 10/2020 | Laflaquiere et al. |
| 2021/0003385 A1 | 1/2021 | Tan et al. |
| 2021/0091244 A1 | 3/2021 | Li et al. |
| 2021/0159108 A1 | 5/2021 | Or-Bach et al. |
| 2021/0167572 A1 | 6/2021 | Tabata et al. |

FOREIGN PATENT DOCUMENTS

| | | |
|---|---|---|
| CN | 107608040 A | 1/2018 |
| CN | 108269814 A | 7/2018 |
| CN | 109585469 A | 4/2019 |
| CN | 110196106 A | 9/2019 |
| EP | 1508946 A1 | 2/2005 |
| EP | 2696229 A2 | 2/2014 |
| EP | 3588700 A1 | 1/2020 |

OTHER PUBLICATIONS

Ng et al., "Long wavelength bulk GaInNAs p-i-n photodiodes lattice matched to GaAs", Journal of Applied Physics, vol. 101, issue 6, pp. 1-6, year 2007.

Beyne, "3D System Integration—Technology Elements," Presentation, 2020 Symposia on VLSI Technology and Circuits, slides 42-49, year 2020.

KR Application # 1020220064043 Office Action dated Jul. 25, 2024.

Chinese Office Action # 202210595722.0, dated Jun. 24, 2025.

Translation of Chinese Office Action # 202210595722.0, dated Jun. 24, 2025.

* cited by examiner

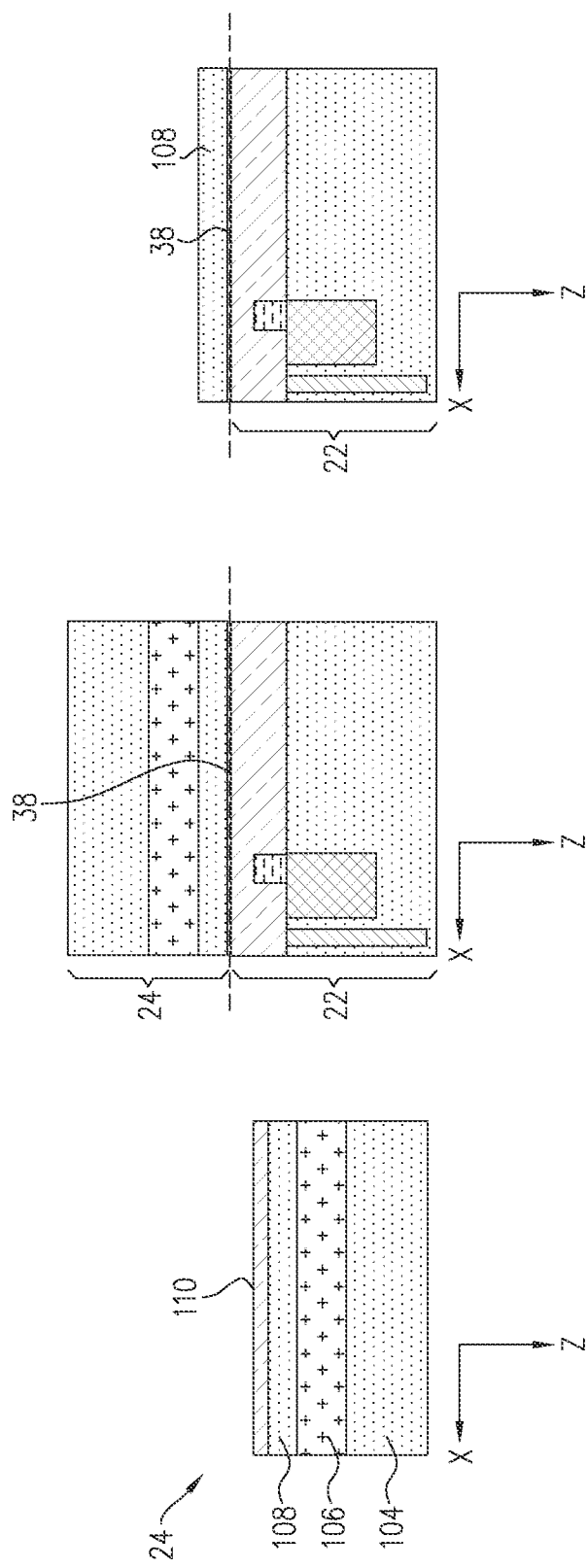

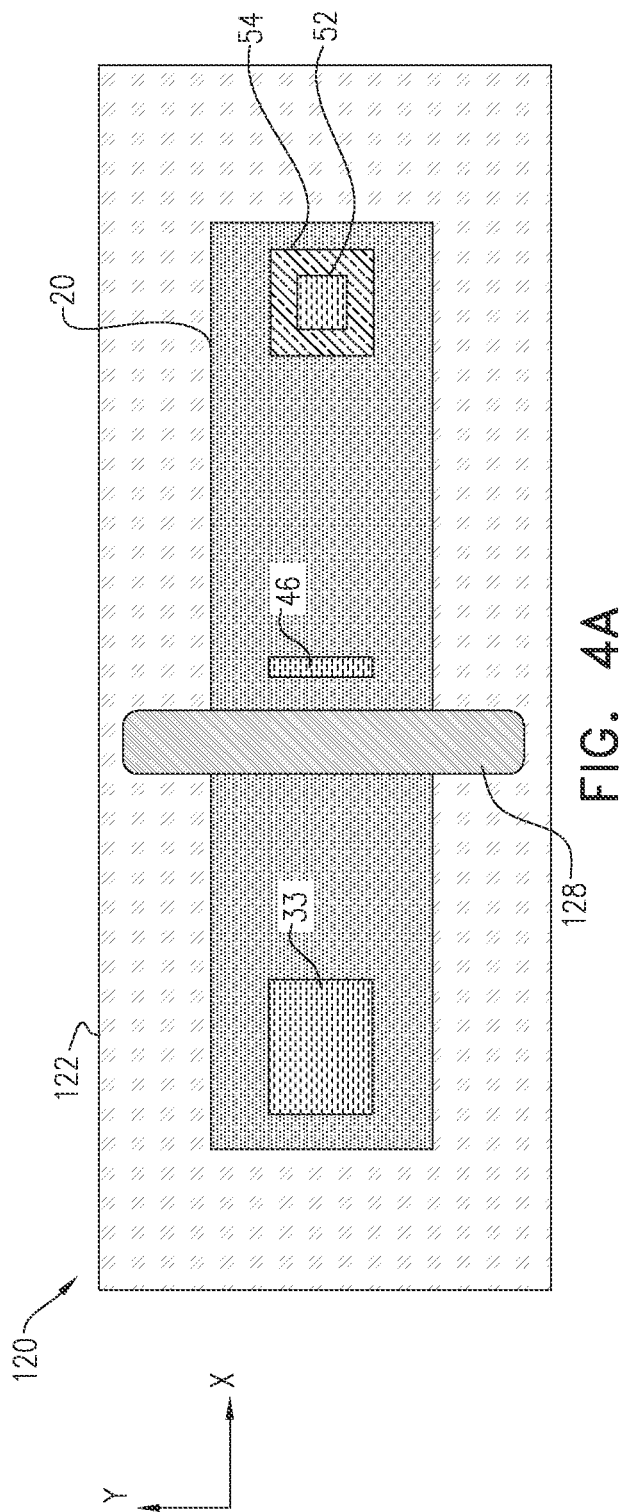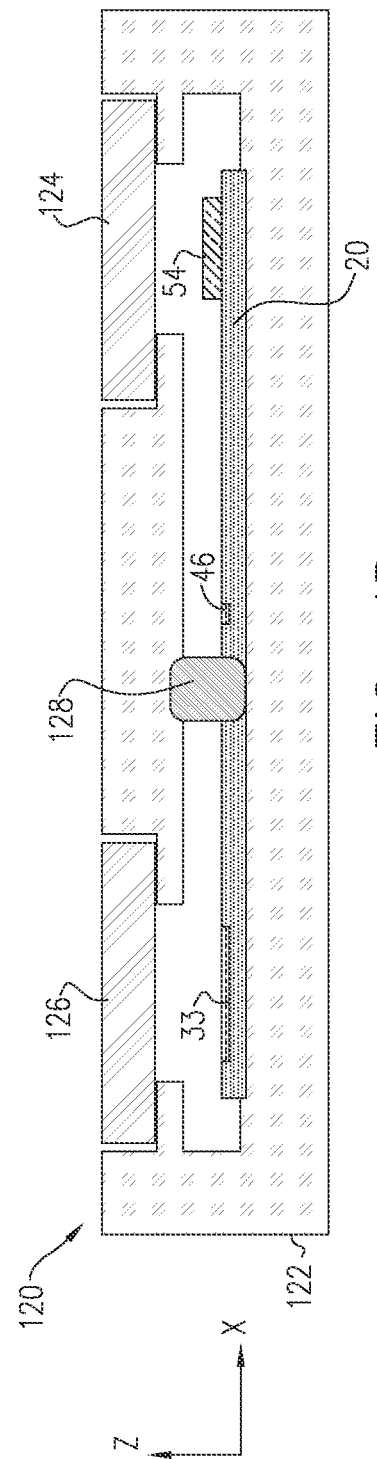
FIG. 4A
FIG. 4B

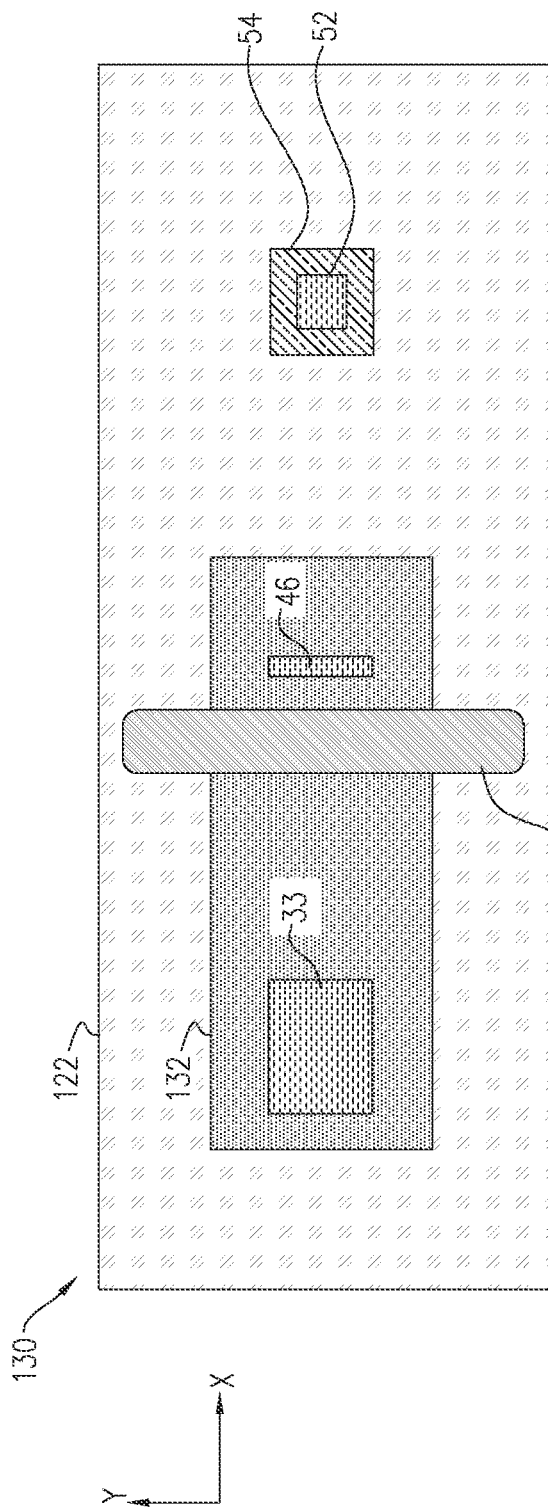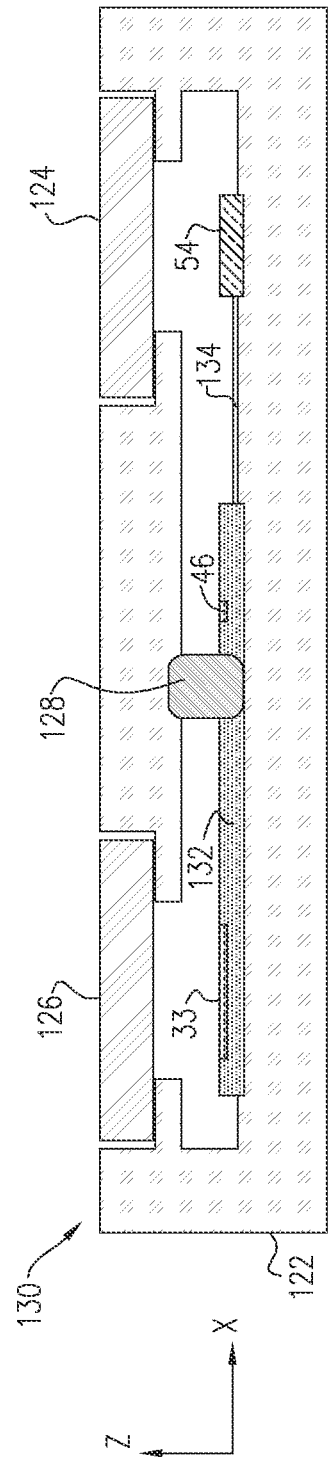
FIG. 5A
FIG. 5B

SINGLE-CHIP OPTICAL TRANSCEIVER

CROSS-REFERENCE TO RELATED APPLICATION

This application claims the benefit of U.S. Provisional Patent Application 63/211,020, filed Jun. 16, 2021, and of U.S. Provisional Patent Application 63/245,878, filed Sep. 19, 2021. Both of these related applications are incorporated herein by reference.

FIELD OF THE INVENTION

The present invention relates generally to optoelectronic devices and methods for their manufacture, and particularly to integrated optical transceivers.

BACKGROUND

Sensors for direct time-of-flight (dToF) depth measurement typically include one or more laser emitters, such as vertical-cavity surface-emitting lasers (VCSELs), and an array of single-photon detectors, such as single-photon avalanche diodes (SPADs). The emitter or emitters direct light pulses toward a target scene, and the detectors output electrical pulses in response to incident photons that have been reflected from the scene. The timespans between an emitted light pulse and the resulting electrical pulses are indicative of the time of flight of the photons and thus of the distances to the points in the scene from which the photons were reflected.

SUMMARY

Embodiments of the present invention that are described hereinbelow provide integrated optical transceivers and methods for producing such transceivers.

There is therefore provided, in accordance with an embodiment of the invention, an optoelectronic device, which includes a first semiconductor die, having first front and rear surfaces, and including at least one avalanche photodetector configured to output electrical pulses in response to photons incident on the first front surface. A second semiconductor die has a second front surface, which is bonded to the first rear surface, and a second rear surface, and includes a photodetector receiver analog circuit coupled to the at least one avalanche photodetector and an emitter driver circuit configured to drive a pulsed optical emitter. A third semiconductor die has a third front surface, which is bonded to the second rear surface, and a third rear surface, and includes logic circuits coupled to control the photodetector receiver analog circuit and the emitter driver circuit and to receive and process the electrical pulses output by the at least one avalanche photodetector.

In some embodiments, the first, second, and third semiconductor dies include silicon dies. In some of these embodiments, the device includes a III-V semiconductor die, having fourth front and rear surfaces, and including the optical emitter, which is coupled to be driven by the emitter driver circuit and is configured to output optical pulses through the fourth front surface. In one embodiment, the optical emitter includes a vertical-cavity surface-emitting laser (VCSEL). Additionally or alternatively, the first semiconductor die includes first electrical contacts on the first front surface, and the III-V semiconductor die is mounted on the first front surface and includes second electrical contacts, which are connected to the first electrical contacts. In an alternative embodiment, the device includes a carrier substrate, wherein the III-V semiconductor die and the third semiconductor die are both mounted on the carrier substrate.

In a disclosed embodiment, the at least one avalanche photodetector includes a single-photon avalanche detector (SPAD). Alternatively or additionally, the at least one avalanche photodetector includes an array of multiple photodetectors.

In some embodiments, the first rear surface is bonded to the second front surface by an oxide bond. In a disclosed embodiment, the second rear surface and the third front surface include respective metal pads and are bonded together by hybrid bonding between the respective metal pads.

Additionally or alternatively, the logic circuits in the third die include complementary metal-oxide-semiconductor (CMOS) logic, while the drive circuits in the second die include n-type metal-oxide-semiconductor (NMOS) transistors or p-type metal-oxide-semiconductor (PMOS) transistors.

Further additionally or alternatively, the first semiconductor die includes a metal layer, which is disposed between the at least one avalanche photodetector and the first rear surface and shields the photodetector receiver analog circuit from the incident photons.

There is also provided, in accordance with an embodiment of the invention, a method for fabricating an optoelectronic device. The method includes forming in a first semiconductor die at least one avalanche photodetector, which is configured to output electrical pulses in response to photons incident on a first front surface of the first semiconductor die. A second front surface of a second semiconductor die is bonded to a first rear surface of the first semiconductor die. A photodetector receiver analog circuit coupled to the at least one avalanche photodetector and an emitter driver circuit, which is configured to drive a pulsed optical emitter, are formed in the second semiconductor die. Logic circuits are formed in a third semiconductor die. A third front surface of the third semiconductor die is bonded to a second rear surface of the second semiconductor die so as to couple the logic circuits to control the photodetector receiver analog circuit and the emitter driver circuit and to receive and process the electrical pulses output by the at least one avalanche photodetector.

The present invention will be more fully understood from the following detailed description of the embodiments thereof, taken together with the drawings in which:

BRIEF DESCRIPTION OF THE DRAWINGS

FIGS. 3A, 3B, 3C, 3D, 3E, 3F, 3G and 3H are schematic sectional views showing a sequence of manufacturing steps in fabrication of a stacked optical transceiver chip, in accordance with an embodiment of the invention; and FIGS. 4A and 4B are schematic top and sectional views, respectively, of an optical transceiver device, in accordance with an embodiment of the invention; and FIGS. 5A and 5B are schematic top and sectional views, respectively, of an optical transceiver device, in accordance with another embodiment of the invention.

DETAILED DESCRIPTION OF EMBODIMENTS

Figure 1:
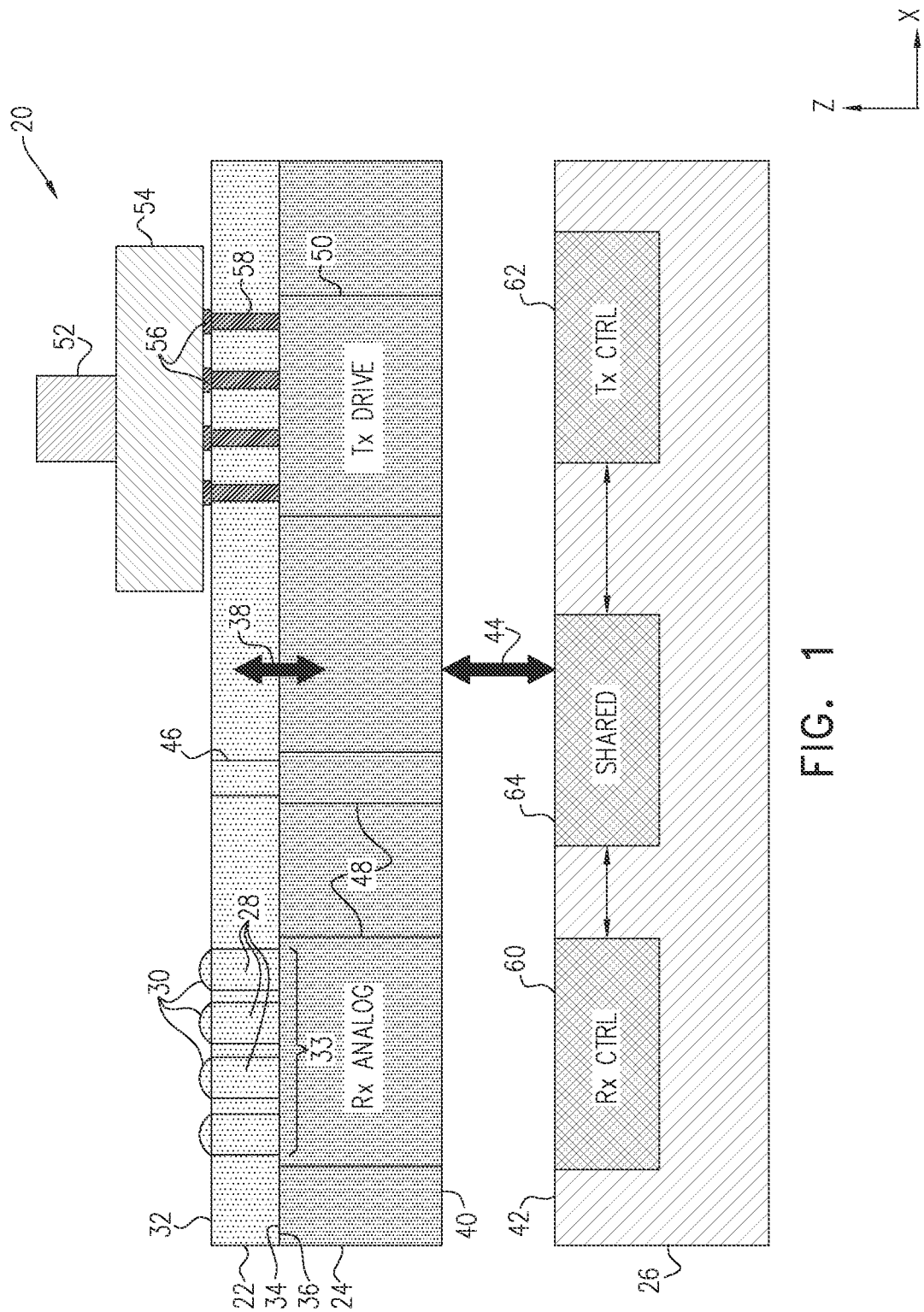
FIG. 1 is a schematic sectional view of an integrated optical transceiver, in accordance with an embodiment of the invention.

For mass-market applications of dToF depth sensing, it is desirable that the sensor be made as small and inexpensive as possible. For this purpose, for example, all driving and control functions should be integrated on a single silicon chip together with an array of single-photon detectors, such as SPADs. The emitters, such as VCSELs, are typically fabricated on a separate III-V semiconductor substrate, such as GaAs, but can be mounted either on top of the silicon chip, for example using VCSEL-on-silicon technologies, or alongside the silicon chip in close proximity. The emitter (Tx) and detector (Rx) circuits can then share circuit elements such as a phase-locked loop (PLL), temperature sensor, high-voltage bias circuitry, control and interface logic, and memory, thus reducing the overall chip area. Creating this sort of integrated chip is difficult, however, because of the need to integrate and accommodate the diverse requirements of optoelectronics, high-voltage drive components, and high-speed logic.

Embodiments of the present invention that are described herein address this problem using three silicon wafers that are stacked and bonded together. After fabricating the device components and bonding the wafers together, the bonded wafers are diced to produce multiple integrated transceiver chips. Each such chip thus comprises three semiconductor dies:

- The first semiconductor die comprises at least one avalanche photodetector, which outputs electrical pulses in response to photons incident on the front surface of the die. In the embodiments described below, the first die comprises an array of photodetectors, such as SPADs, which enables the devices to sense incoming photons with finer spatial resolution and/or wider dynamic range.
- The front surface of the second semiconductor die is bonded to the rear surface of the first semiconductor die, for example by oxide bonding (also referred to as sequential bonding). This second die comprises high-voltage circuits, including a photodetector receiver analog circuit coupled to the photodetectors in the first die and an emitter driver circuit, for driving a pulsed optical emitter, such as a VCSEL.
- The front surface of the third semiconductor die is bonded to the rear surface of the second semiconductor die, for example by hybrid bonding between metal pads at the two surfaces. The third die comprises low-voltage logic circuits, which control the photodetector receiver analog circuit and the emitter driver circuit, and which receive and process the electrical pulses output by the photodetectors.

The terms "high-voltage" and "low-voltage" are used in a relative sense, as the ranges of "high" and "low" voltages depend on the technologies that are used. For example, considering technologies that are currently available, the logic circuits in the third die may comprise complementary metal-oxide-semiconductor (CMOS) logic, which operates at voltages in the range of 0.7-3 volts; while the drive circuits in the second die comprise n-type metal-oxide-semiconductor (NMOS) transistors or p-type metal-oxide-semiconductor (PMOS) transistors with thick oxide layers, operating in the range of 3-10 volts. Alternatively, higher or lower voltage ranges may be used. In any case, the application of different circuit technologies in the second and third dies enables the stacked chip to carry out both the high-voltage driving functions and the high-speed logic functions that are involved in operation of the optical transceiver.

In some embodiments, the optical emitter is formed on a III-V semiconductor die, such as a GaAs die, which may be mounted either on a part of the front surface of the first (silicon) die or alongside the stacked chip on a carrier substrate. In either case, combining the detector (Rx) and emitter driving (Tx) functions in a single stacked chip of this sort reduces the net die area in several ways:

- It eliminates the inter-die interface circuits that are needed when the Rx and Tx driving functions are implemented in separate chips, and it reduces the complexity of the logic.
- It reduces the total pad count of the device, since many pads (such as clock, power supply, and control lines) can be shared by the Rx and Tx circuits.
- It enables the Rx and Tx drivers to share high-speed analog and digital circuits, such as oscillators, phase-locked loops (PLLs), and/or delay-locked loops (DLLs).

FIG. 1 is a schematic sectional view of an integrated optical transceiver 20, in accordance with an embodiment of the invention. Transceiver 20 comprises an integrated circuit (IC) chip made up of three semiconductor dies 22, 24 and 26, for example silicon dies, which are stacked and bonded together. The components of transceiver 20 are shown conceptually in FIG. 1 and are not drawn to scale.

SPADs 28 in die 22 receive photons through respective microlenses 30 on a front surface 32 of die 22 and output electrical pulses in response to the incident photons. (The term "front" is used in the context of the present description and in the claims, for the sake of convenience and clarity, to refer to the side of transceiver 20 through which photons are received, while "rear" refers to the opposite side.) Although a single row of SPADs 28 is shown in this figure, die 22 may comprise a smaller or larger number of SPADs, from a single SPAD up to a two-dimensional array 33 including tens, hundreds, or even thousands of SPADs. A rear surface 34 of die 22 is bonded to a front surface 36 of die 24, for example by an oxide (sequential) bond 38. A rear surface 40 of die 24 is bonded to a front surface 42 of die 26, for example by a hybrid bond 44. For the sake of convenience and clarity in the description that follows, the surfaces of the dies (such as surfaces 32, 34, 36, 40 and 42) are taken to be oriented in X-Y planes, with the Z-axis running through the dies in the perpendicular direction.

Die 24 comprises a photodetector receiver (Rx) analog circuit 48, which is coupled to SPADs 28, and an emitter (Tx) drive circuit 50, which drives a pulsed optical emitter, such as a VCSEL 52. In the pictured embodiment, die 22 also contains a reference SPAD 46, or an array of reference SPADs, which are also driven by Rx analog circuit 48. The purpose of reference SPAD 46 is explained further hereinbelow. Rx analog circuit 48 performs functions that include biasing, quenching, and recharging SPADs 28 and 46, as are known in the art. VCSEL 52 is fabricated on a III-V semiconductor die 54, such as a GaAs die, which is then mounted on front surface 32 of die 22 and is attached by electrical contacts 56 to Tx drive circuit 50. Contacts 56 comprise, for example, suitable metal bumps, which are connected by vias 58 to Tx drive circuit 50. The Tx drive circuit outputs short high-voltage electrical pulses, which cause VCSEL 52 to emit short, high-intensity optical pulses.

Die 26 comprises Rx logic circuits 60, which control and receive signals from Rx analog circuit 48, and Tx logic circuits 62, which control Tx drive circuit 50. The locations and relative areas of Rx logic circuits 60 and Tx logic circuits 62 need not match those of the drive circuits in die 24. Tx logic circuits 62 control the timing of the sequence of optical pulses emitted by VCSEL 52. Rx logic circuits 60 receive and process the electrical pulses output by SPADs 28 in order to count the incident photons and measure their timing relative to the outgoing optical pulses. Shared circuits 64 in die 26 perform high-speed timing and digital logic functions that are shared by and coordinate between Rx logic circuits 60 and Tx logic circuits 62. Shared circuits 64 may include, for example, one or more oscillators, PLLs, and/or DLLs, as well as memory and input/output circuits.

Figure 2A:
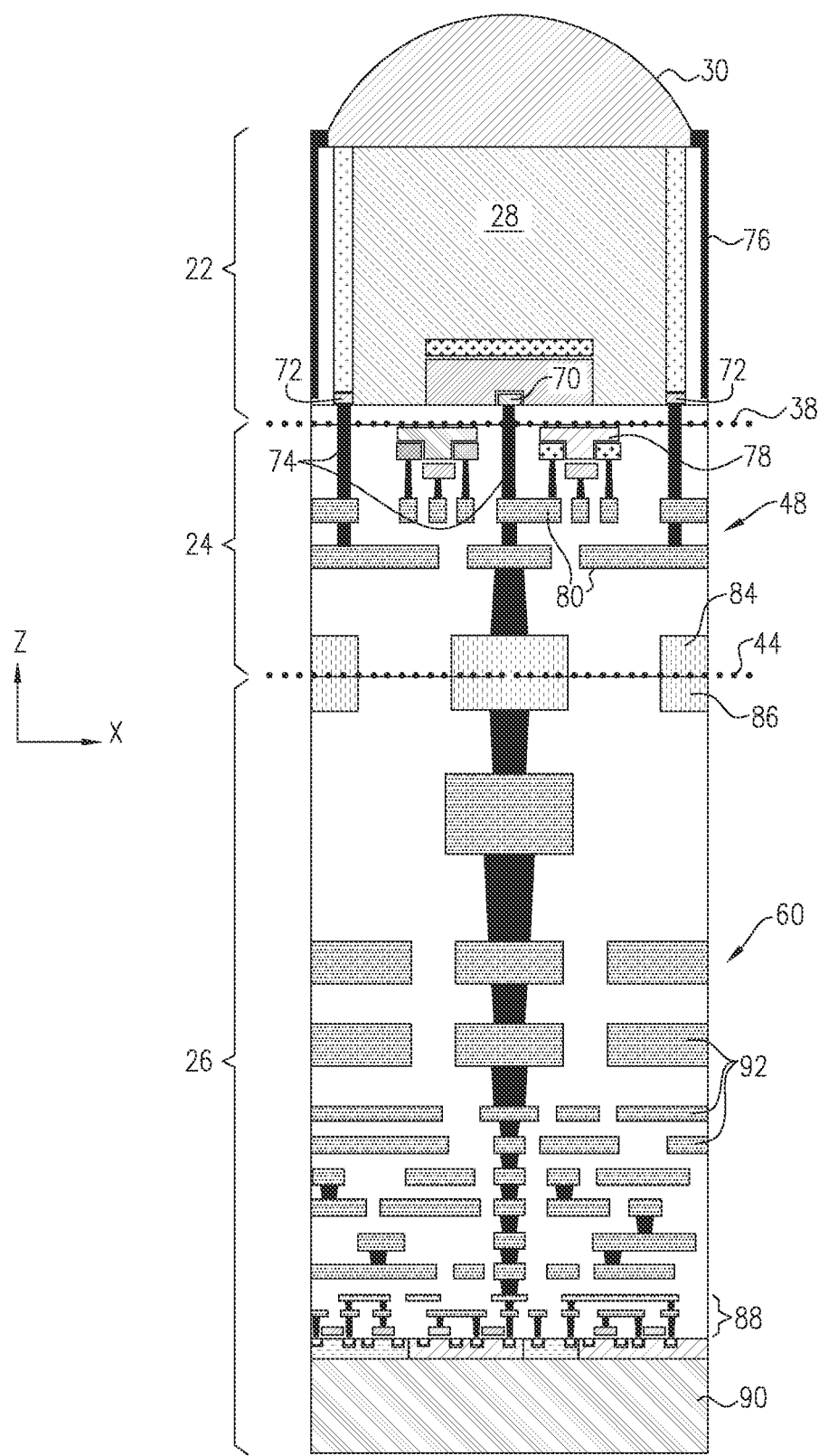
FIGS. 2A and 2B are schematic sectional views showing details of integrated optical transceivers, in accordance with embodiments of the invention.
Figure 2B:
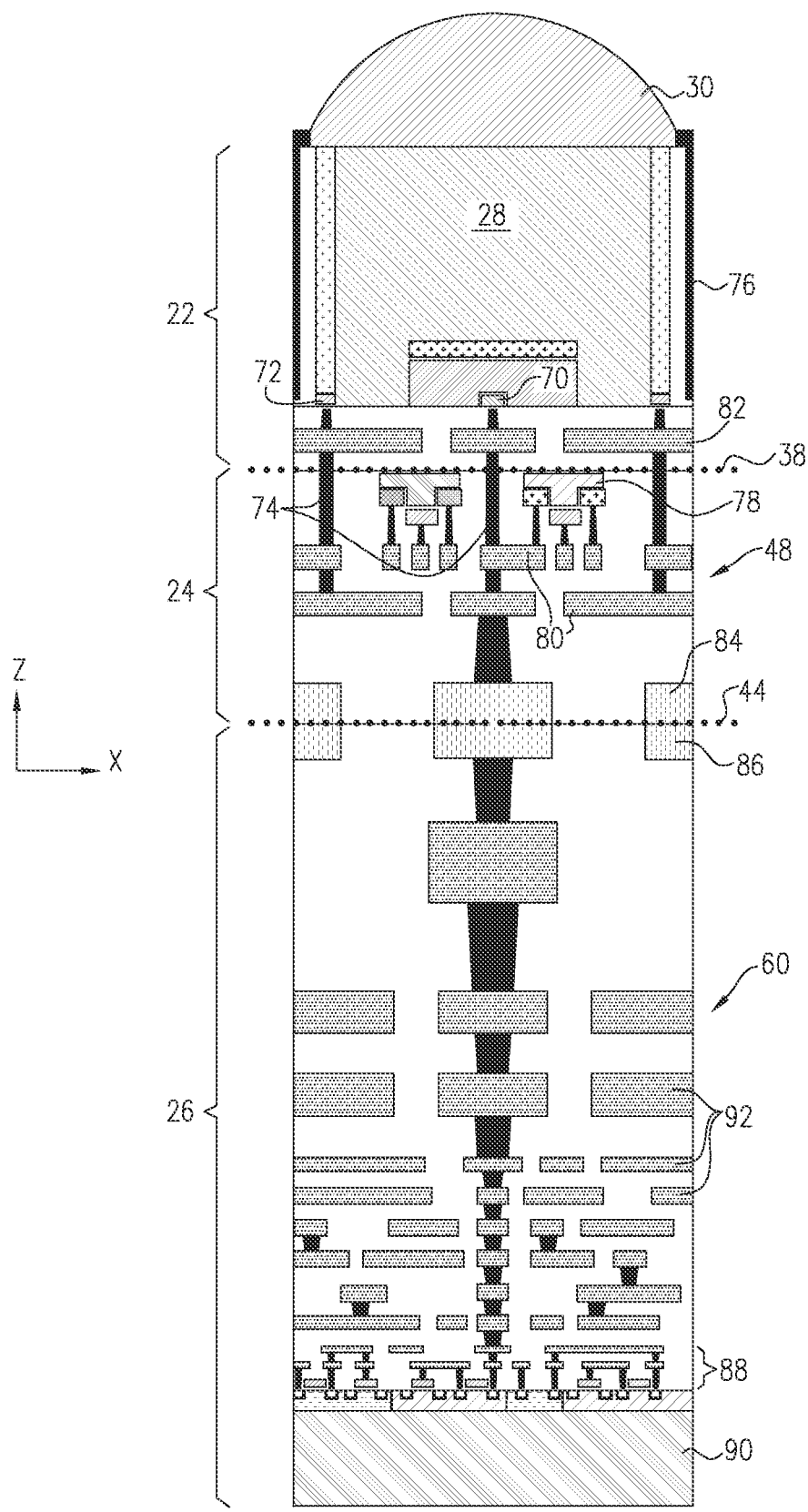

FIGS. 2A and 2B are schematic sectional views showing details of integrated optical transceivers, such as transceiver 20 (FIG. 1), in accordance with embodiments of the invention. Both of these figures show a slice through dies 22, 24 and 26, including a single SPAD 28 and associated parts of Rx analog circuit 48 and Rx logic circuit 60. The two embodiments are very similar, and the description below applies to both embodiments unless noted otherwise.

SPAD 28 comprises an anode contact 70 and cathode contacts 72, which are connected through metal vias 74 to Rx analog circuit 48. Each SPAD is isolated from its neighbors in the SPAD array by metal-filled backside deep trenches 76. Drive circuit 48 comprises high-voltage transistors 78, such as NMOS or PMOS thick-oxide transistors, with metal interconnects 80. In the embodiment of FIG. 2B, a metal layer 82, for example a tungsten layer, extends across the back side of die 22. Metal layer 82 is useful in both enhancing the sensitivity of SPAD 28 and shielding Rx analog circuit 48 and other underlying circuits from incident photons, which could otherwise degrade the device performance.

Hybrid bond 44 between dies 24 and 26 is formed by bonding together metal pads 84 and 86, for example copper pads, at the rear surface of die 24 and the front surface of die 26, respectively. Rx logic circuit 60 comprises CMOS logic 88, which is formed on a silicon substrate 90 of die 26. CMOS logic 88 is connected to Rx analog circuit 48 through metal layers 92 of die 26 and through pads 86 and 84.

FIGS. 3A-3H are schematic sectional illustrations showing a sequence of manufacturing steps in fabrication of transceiver 20, in accordance with an example embodiment. The steps shown in these figures are typically carried out at the wafer level, and the resulting stack of three wafers is diced at the end of the process to create multiple transceiver chips. For the sake of simplicity, however, the figures show only a small part of the wafers, and the wafers are labeled in the figures as dies 22, 24 and 26, in correspondence with the description above.

Figure 3A:
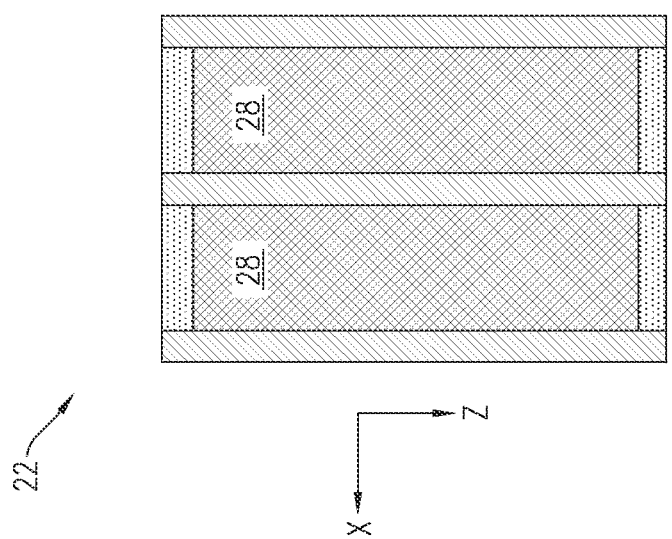
Figure 3B:
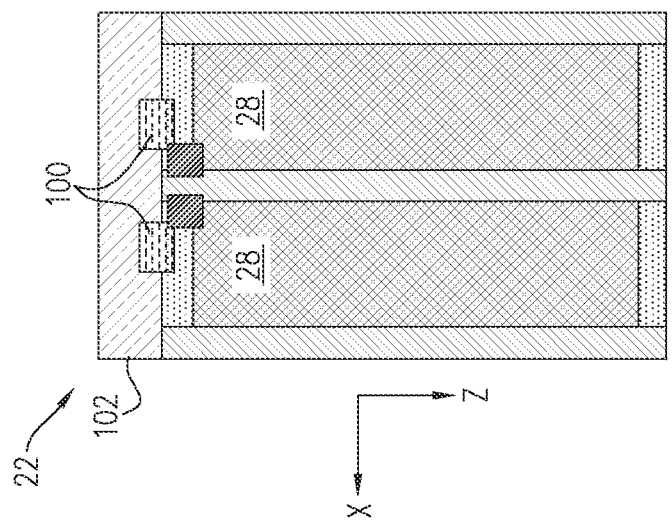

Beginning with FIG. 3A, an array of SPADs 28 is fabricated in the upper silicon wafer (die 22) by appropriate doping of p and n regions, as is known in the art. Readout components 100, including gates and floating diffusion nodes, are deposited over SPADs 28, and are covered by an oxide layer 102, as shown in FIG. 3B. (Die 22 is positioned upside-down in FIGS. 3A through 3F, relative to its orientation in the preceding figures.)

Figures 3F, 3G, 3H:
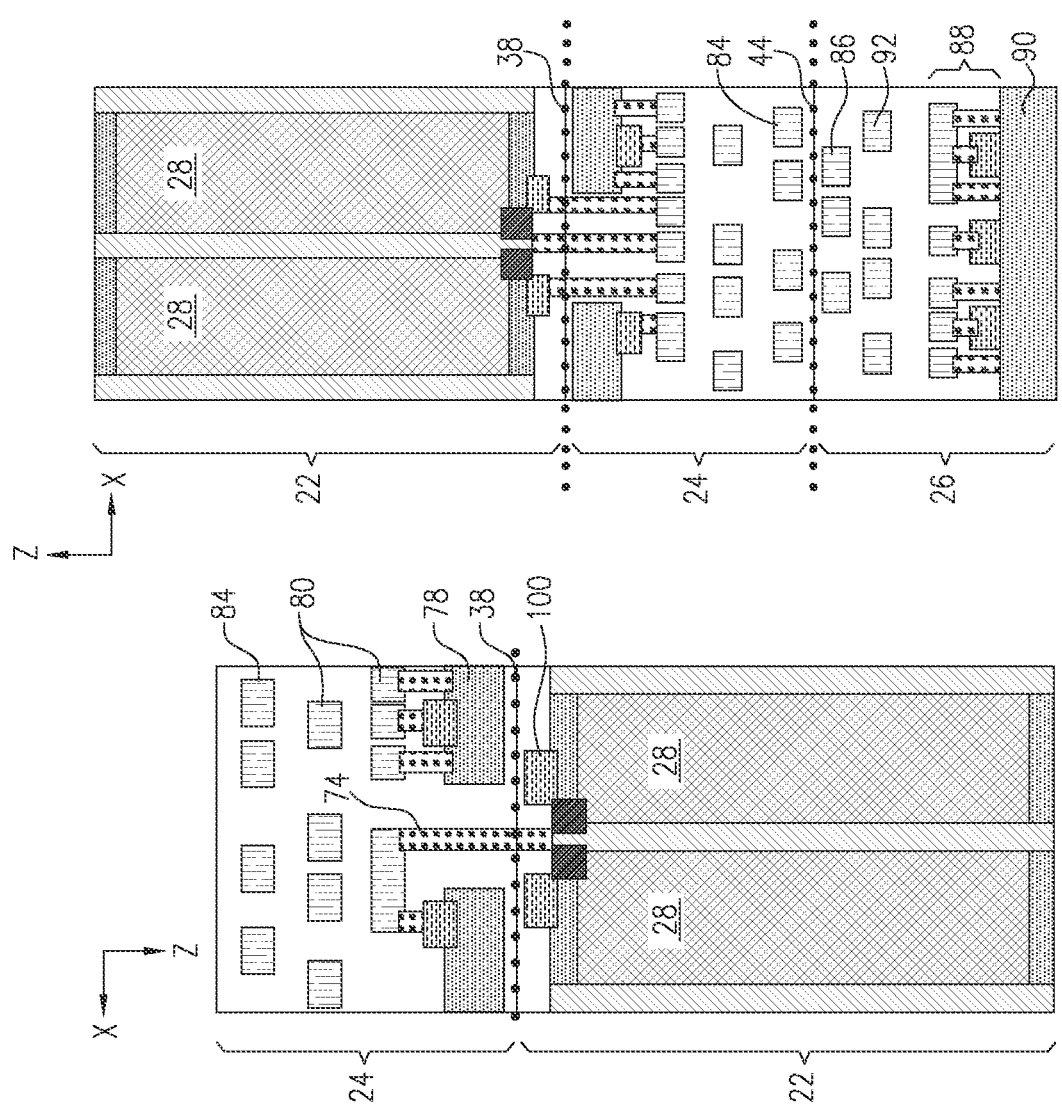

In preparation for processing of die 24, an etch-stop layer 106 and a silicon layer 108 are deposited over a silicon substrate 104 of the middle wafer, as shown in FIG. 3C. Silicon layer 108 is covered by an oxide layer 110. The middle wafer is then flipped and oxide-bonded to oxide layer 102 at the top of the upper wafer, forming oxide bond 38, as shown in FIG. 3D. After bonding, the back side of the middle wafer is thinned, for example by grinding and selective etching to remove silicon substrate 104 and etch-stop layer 106, as shown in FIG. 3E. The high-voltage circuits are then fabricated in the middle wafer, as shown in FIG. 3F. These circuits include transistors 78 (typically thick-oxide PMOS or NMOS) and other sensor driver components, as well as contacts and wiring, including vias 74 and interconnects 80. Copper pads 84 are deposited and etched at the upper side of the wafer (in this upside-down orientation) for purposes of hybrid bonding.

The circuits of logic 88 and metal layers 92 on substrate 90 of the bottom wafer (die 26) are fabricated separately, for example using a CMOS process. Copper pads 86 are similarly formed at the upper side of this wafer. The bonded upper and middle wafers (dies 22 and 24) are then flipped and overlaid on the bottom wafer (die 26), as shown in FIG. 3G. Pads 84 are aligned with pads 86, and the wafers are annealed to form hybrid bond 44 between the middle and bottom wafers. Finally, optical components, such as wavelength filters 112 and microlenses 30, are fabricated over SPADs 28. The wafers are then diced to create multiple singulated transceivers 20.

FIGS. 4A and 4B are schematic top and sectional views, respectively, of an optical transceiver device 120, in accordance with an embodiment of the invention. Device 120 comprises integrated optical transceiver 20, as described above, with VCSEL 52 on III-V semiconductor die 54 mounted on upper surface 32 of the transceiver chip. Transceiver 20 is mounted on a carrier substrate 122, such as a ceramic printed circuit board.

VCSEL 52 emits photons through an exit window 124 toward a target scene. Photons reflected from the target scene are incident on array 33 of SPADs 28 via an entrance window 126. In addition to array 33, transceiver 20 includes one or more reference SPADs 46, as noted above. These reference SPADs receive stray photons reflected from VCSEL 52 and thus provides a start signal for measurement of the time of flight of the photons received by SPADs 28 in array 33. A light block 128 within device 120 prevents optical crosstalk between VCSEL 52 and the SPADs in array 33.

FIGS. 5A and 5B are schematic top and sectional views, respectively, of an optical transceiver device 130, in accordance with another embodiment of the invention. In this embodiment, III-V semiconductor die 54 with VCSEL 52 is mounted on carrier substrate 122 separately from a stacked SPAD chip 132. Chip 132 contains substantially the same components as transceiver 20, but Tx drive circuit 50 (FIG. 1) outputs drive signals from SPAD chip 132 to III-V semiconductor die 54 via conductors 134 on carrier substrate 122, rather than via contacts on the SPAD chip itself. In other respects, the operation of device 130 is similar to that of device 120 (FIGS. 4A/B).

Although the embodiments described above are directed specifically to dToF depth sensing, the principles of the present invention may similarly be applied, mutatis mutandis, in producing and operating other sorts of integrated optical transceivers, both for depth sensing and for other applications. Thus, the specific sorts of optical emitters and photodetectors that are used in the disclosed embodiments—i.e., a VCSEL emitter and an array of SPAD detectors—may be replaced, for example, by other types of avalanche diodes or single-photon detectors, as well as other types of pulsed optical emitters. Furthermore, although silicon technologies are currently best suited for producing the stacked chips described above, the principles of the present invention may similarly be applied in producing stacked chips based on other sorts of semiconductors, such as III-V semiconductor dies. By appropriate choices of materials and technologies, the present devices and methods may be adapted for use in the infrared, visible, or even ultraviolet range of optical radiation. All such alternative implementations and applications are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
a first semiconductor die, having first front and rear surfaces, and comprising at least one avalanche photodetector configured to output electrical pulses in response to photons incident on the first front surface;
a second semiconductor die, having a second front surface, which is bonded to the first rear surface, and a second rear surface, and comprising a photodetector receiver analog circuit coupled to the at least one avalanche photodetector and an emitter driver circuit configured to drive a pulsed optical emitter; and
a third semiconductor die, having a third front surface, which is bonded to the second rear surface, and a third rear surface, and comprising logic circuits coupled to control the photodetector receiver analog circuit and the emitter driver circuit and to receive and process the electrical pulses output by the at least one avalanche photodetector.

2. The device according to claim 1, wherein the first, second, and third semiconductor dies comprise silicon dies.

3. The device according to claim 2, and comprising a III-V semiconductor die, having fourth front and rear surfaces, and comprising the optical emitter, which is coupled to be driven by the emitter driver circuit and is configured to output optical pulses through the fourth front surface.

4. The device according to claim 3, wherein the optical emitter comprises a vertical-cavity surface-emitting laser (VCSEL).

5. The device according to claim 3, wherein the first semiconductor die comprises first electrical contacts on the first front surface, and wherein the III-V semiconductor die is mounted on the first front surface and comprises second electrical contacts, which are connected to the first electrical contacts.

6. The device according to claim 3, and comprising a carrier substrate, wherein the III-V semiconductor die and the third semiconductor die are both mounted on the carrier substrate.

7. The device according to claim 1, wherein the at least one avalanche photodetector comprises a single-photon avalanche detector (SPAD).

8. The device according to claim 1, wherein the at least one avalanche photodetector comprises an array of multiple photodetectors.

9. The device according to claim 1, wherein the first rear surface is bonded to the second front surface by an oxide bond.

10. The device according to claim 9, wherein the second rear surface and the third front surface comprise respective metal pads and are bonded together by hybrid bonding between the respective metal pads.

11. The device according to claim 1, wherein the logic circuits in the third semiconductor die comprise complementary metal-oxide-semiconductor (CMOS) logic, while the emitter driver circuit in the second semiconductor die comprises n-type metal-oxide-semiconductor (NMOS) transistors or p-type metal-oxide-semiconductor (PMOS) transistors.

12. The device according to claim 1, wherein the first semiconductor die comprises a metal layer, which is disposed between the at least one avalanche photodetector and the first rear surface and shields the photodetector receiver analog circuit from the incident photons.

13. A method for fabricating an optoelectronic device, the method comprising:
forming in a first semiconductor die at least one avalanche photodetector, which is configured to output electrical pulses in response to photons incident on a first front surface of the first semiconductor die;
bonding a second front surface of a second semiconductor die to a first rear surface of the first semiconductor die;
forming in the second semiconductor die a photodetector receiver analog circuit coupled to the at least one avalanche photodetector and an emitter driver circuit, which is configured to drive a pulsed optical emitter;
forming logic circuits in a third semiconductor die; and
bonding a third front surface of the third semiconductor die to a second rear surface of the second semiconductor die so as to couple the logic circuits to control the photodetector receiver analog circuit and the emitter driver circuit and to receive and process the electrical pulses output by the at least one avalanche photodetector.

14. The method according to claim 13, wherein the first, second, and third semiconductor dies comprise silicon dies.

15. The method according to claim 14, and comprising coupling a III-V semiconductor die, having fourth front and rear surfaces and comprising the optical emitter, to be driven by the emitter driver circuit so as to output optical pulses through the fourth front surface.

16. The method according to claim 13, wherein the at least one avalanche photodetector comprises one or more single-photon avalanche detectors (SPADs).

17. The method according to claim 13, wherein bonding the second front surface of the second semiconductor die to the first rear surface of the first semiconductor die comprises forming an oxide bond between the first rear surface and the second front surface.

18. The method according to claim 17, wherein bonding the third front surface of the third semiconductor die to the second rear surface of the second semiconductor die comprises forming respective metal pads on the second and third semiconductor dies, and bonding the third front surface to the second rear surface by hybrid bonding between the respective metal pads.

19. The method according to claim 13, wherein the logic circuits in the third die comprise complementary metal-oxide-semiconductor (CMOS) logic, while the drive circuits in the second die comprise n-type metal-oxide-semiconductor (NMOS) transistors or p-type metal-oxide-semiconductor (PMOS) transistors.

20. The method according to claim 13, and comprising depositing a metal layer on the first semiconductor die, so that the metal layer is disposed between the at least one avalanche photodetector and the first rear surface and shields the photodetector receiver analog circuit from the incident photons.

* * * * *